(12) United States Patent
Crafts et al.

(10) Patent No.: US 8,926,803 B2
(45) Date of Patent: Jan. 6, 2015

(54) POROUS SILICON ELECTRO-ETCHING SYSTEM AND METHOD

(75) Inventors: Doug Crafts, Los Gatos, CA (US); Mehrdad Moslehi, Los Altos, CA (US); Subramanian Tamilmani, San Jose, CA (US); Joe Kramer, San Jose, CA (US); George D. Kamian, Scotts Valley, CA (US); Somnath Nag, Saratoga, CA (US)

(73) Assignee: Solexel, Inc., Milpitas, CA (US)

( * ) Notice: Subject to any disclaimer, the term of this patent is extended or adjusted under 35 U.S.C. 154(b) by 1136 days.

(21) Appl. No.: 12/688,495

(22) Filed: Jan. 15, 2010
(Under 37 CFR 1.47)

(65) Prior Publication Data
US 2011/0120882 A1  May 26, 2011

Related U.S. Application Data

(60) Provisional application No. 61/145,018, filed on Jan. 15, 2009.

(51) Int. Cl.
*C25D 17/00* (2006.01)
*H01L 31/18* (2006.01)
*H01L 21/67* (2006.01)
*H01L 21/677* (2006.01)

(52) U.S. Cl.
CPC ...... *H01L 31/1804* (2013.01); *H01L 21/67005* (2013.01); *H01L 21/67075* (2013.01); *H01L 21/67086* (2013.01); *H01L 21/6776* (2013.01); *Y02E 10/547* (2013.01)
USPC ............ 204/198; 204/202; 205/137; 205/316

(58) Field of Classification Search
USPC ............................................... 204/198, 202
See application file for complete search history.

(56) References Cited

U.S. PATENT DOCUMENTS

| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |

(Continued)

FOREIGN PATENT DOCUMENTS

| EP | 0597428 | 5/1994 |
| EP | 0879902 | 11/1998 |
| JP | 06-260670 A | 9/1994 |

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Bryan D. Ripa

(57) ABSTRACT

It is an object of this disclosure to provide high productivity, low cost-of-ownership manufacturing equipment for the high volume production of photovoltaic (PV) solar cell device architecture. It is a further object of this disclosure to reduce material processing steps and material cost compared to existing technologies by using gas-phase source silicon. The present disclosure teaches the fabrication of a sacrificial substrate base layer that is compatible with a gas-phase substrate growth process. Porous silicon is used as the sacrificial layer in the present disclosure. Further, the present disclosure provides equipment to produce a sacrificial porous silicon PV cell-substrate base layer.

20 Claims, 16 Drawing Sheets

(56) References Cited

U.S. PATENT DOCUMENTS

| | | | |
|---|---|---|---|
| 4,251,679 A | 2/1981 | Zwan | |
| 4,348,254 A | 9/1982 | Lindmayer | |
| 4,361,950 A | 12/1982 | Amick | |
| 4,409,423 A | 10/1983 | Holt | |
| 4,427,839 A | 1/1984 | Hall | |
| 4,461,922 A | 7/1984 | Gay et al. | |
| 4,479,847 A | 10/1984 | McCaldin et al. | |
| 4,626,613 A | 12/1986 | Wenham et al. | |
| 4,672,023 A | 6/1987 | Leung | |
| 4,922,277 A | 5/1990 | Carlson | |
| 5,024,953 A | 6/1991 | Uematsu et al. | |
| 5,073,230 A | 12/1991 | Maracas et al. | |
| 5,112,453 A | 5/1992 | Behr et al. | |
| 5,208,068 A | 5/1993 | Davis | |
| 5,248,621 A | 9/1993 | Sano | |
| 5,316,593 A | 5/1994 | Olson et al. | |
| 5,348,618 A | 9/1994 | Canham et al. | |
| 5,358,600 A | 10/1994 | Canham et al. | |
| 5,397,400 A | 3/1995 | Matsuno et al. | |
| 5,458,755 A * | 10/1995 | Fujiyama et al. | 204/224 R |
| 5,459,099 A | 10/1995 | Hsu | |
| 5,494,832 A | 2/1996 | Lehmann et al. | |
| 5,538,564 A | 7/1996 | Kaschmitter | |
| 5,645,684 A | 7/1997 | Keller | |
| 5,660,680 A | 8/1997 | Keller | |
| 5,679,233 A * | 10/1997 | Van Anglen et al. | 205/93 |
| 5,681,392 A | 10/1997 | Swain | |
| 5,689,603 A * | 11/1997 | Huth | 385/131 |
| 5,882,988 A | 3/1999 | Haberern et al. | |
| 5,928,438 A | 7/1999 | Salami | |
| 6,091,021 A | 7/2000 | Ruby | |
| 6,096,229 A | 8/2000 | Shahid | |
| 6,114,046 A | 9/2000 | Hanoka | |
| 6,127,623 A | 10/2000 | Nakamura et al. | |
| 6,204,443 B1 | 3/2001 | Kiso et al. | |
| 6,254,759 B1 * | 7/2001 | Rasmussen | 205/324 |
| 6,294,725 B1 | 9/2001 | Hirschberg et al. | |
| 6,331,208 B1 | 12/2001 | Nishida et al. | |
| 6,399,143 B1 | 6/2002 | Sun et al. | |
| 6,416,647 B1 | 7/2002 | Dordi et al. | |
| 6,429,037 B1 | 8/2002 | Wenham et al. | |
| 6,441,297 B1 | 8/2002 | Keller et al. | |
| 6,448,155 B1 | 9/2002 | Iwasaki et al. | |
| 6,461,932 B1 | 10/2002 | Wang | |
| 6,517,697 B1 * | 2/2003 | Yamagata | 205/147 |
| 6,524,880 B2 | 2/2003 | Moon et al. | |
| 6,534,336 B1 | 3/2003 | Iwane | |
| 6,555,443 B1 | 4/2003 | Artmann et al. | |
| 6,566,235 B2 | 5/2003 | Nishida et al. | |
| 6,602,760 B2 | 8/2003 | Poortmans et al. | |
| 6,602,767 B2 | 8/2003 | Nishida et al. | |
| 6,613,148 B1 | 9/2003 | Rasmussen | |
| 6,624,009 B1 | 9/2003 | Green et al. | |
| 6,645,833 B2 | 11/2003 | Brendel | |
| 6,649,485 B2 | 11/2003 | Solanki et al. | |
| 6,653,722 B2 | 11/2003 | Blalock | |
| 6,664,169 B1 | 12/2003 | Iwasaki et al. | |
| 6,756,289 B1 | 6/2004 | Nakagawa et al. | |
| 6,881,644 B2 | 4/2005 | Malik et al. | |
| 6,946,052 B2 | 9/2005 | Yanagita et al. | |
| 6,964,732 B2 | 11/2005 | Solanki | |
| 7,014,748 B2 * | 3/2006 | Matsumura et al. | 205/124 |
| 7,022,585 B2 | 4/2006 | Solanki et al. | |
| 7,026,237 B2 | 4/2006 | Lamb | |
| 7,368,756 B2 | 5/2008 | Bruhns et al. | |
| 7,402,523 B2 | 7/2008 | Nishimura | |
| 2002/0153039 A1 | 10/2002 | Moon et al. | |
| 2002/0168592 A1 | 11/2002 | Vezenov | |
| 2002/0179140 A1 | 12/2002 | Toyomura | |
| 2003/0017712 A1 | 1/2003 | Brendel | |
| 2003/0039843 A1 | 2/2003 | Johnson | |
| 2003/0124761 A1 | 7/2003 | Baert | |
| 2004/0028875 A1 | 2/2004 | Van Rijn | |
| 2004/0173790 A1 | 9/2004 | Yeo | |
| 2004/0217005 A1 * | 11/2004 | Rosenfeld et al. | 205/82 |
| 2004/0259335 A1 | 12/2004 | Narayanan | |
| 2004/0265587 A1 | 12/2004 | Koyanagi | |
| 2005/0160970 A1 | 7/2005 | Niira | |
| 2005/0172998 A1 | 8/2005 | Gee et al. | |
| 2005/0176164 A1 | 8/2005 | Gee et al. | |
| 2005/0177343 A1 | 8/2005 | Nagae | |
| 2005/0199279 A1 | 9/2005 | Yoshimine et al. | |
| 2005/0274410 A1 | 12/2005 | Yuuki et al. | |
| 2005/0281982 A1 | 12/2005 | Li | |
| 2006/0021565 A1 | 2/2006 | Zahler et al. | |
| 2006/0043495 A1 | 3/2006 | Uno | |
| 2006/0054212 A1 | 3/2006 | Fraas et al. | |
| 2006/0070884 A1 * | 4/2006 | Momoi et al. | 205/118 |
| 2006/0105492 A1 | 5/2006 | Veres et al. | |
| 2006/0196536 A1 | 9/2006 | Fujioka | |
| 2006/0231031 A1 | 10/2006 | Dings et al. | |
| 2006/0266916 A1 | 11/2006 | Miller et al. | |
| 2006/0283495 A1 | 12/2006 | Gibson | |
| 2007/0077770 A1 | 4/2007 | Wang et al. | |
| 2007/0082499 A1 | 4/2007 | Jung et al. | |
| 2008/0047601 A1 | 2/2008 | Nag et al. | |
| 2008/0157283 A1 | 7/2008 | Moslehi | |
| 2008/0210294 A1 | 9/2008 | Moslehi | |
| 2008/0264477 A1 | 10/2008 | Moslehi | |
| 2008/0277885 A1 * | 11/2008 | Duff et al. | 279/3 |
| 2008/0289684 A1 | 11/2008 | Moslehi | |
| 2008/0295887 A1 | 12/2008 | Moslehi | |
| 2009/0042320 A1 | 2/2009 | Wang et al. | |
| 2009/0107545 A1 | 4/2009 | Moslehi | |
| 2009/0301549 A1 | 12/2009 | Moslehi | |
| 2010/0022074 A1 | 1/2010 | Wang et al. | |
| 2010/0116316 A1 | 5/2010 | Moslehi et al. | |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

(56) References Cited

OTHER PUBLICATIONS

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

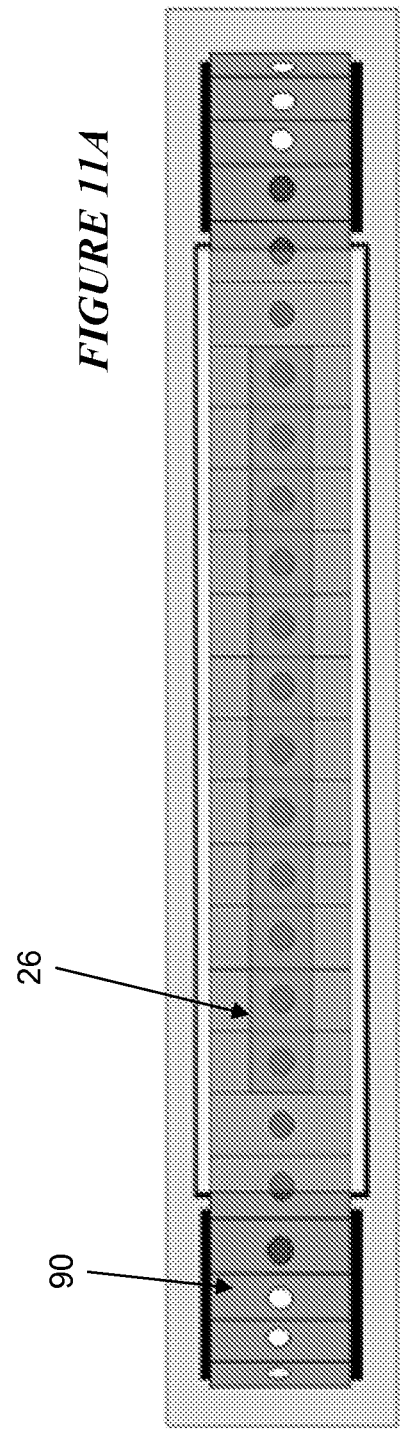
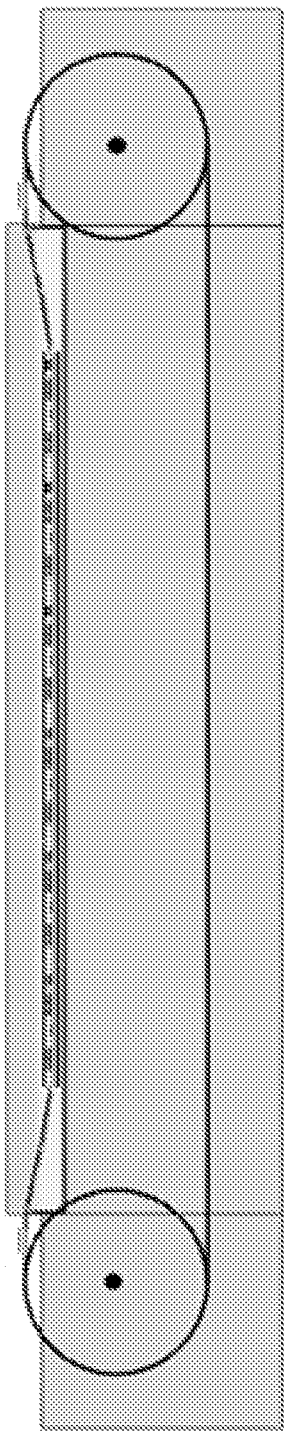
*FIGURE 11A*
*FIGURE 11B*

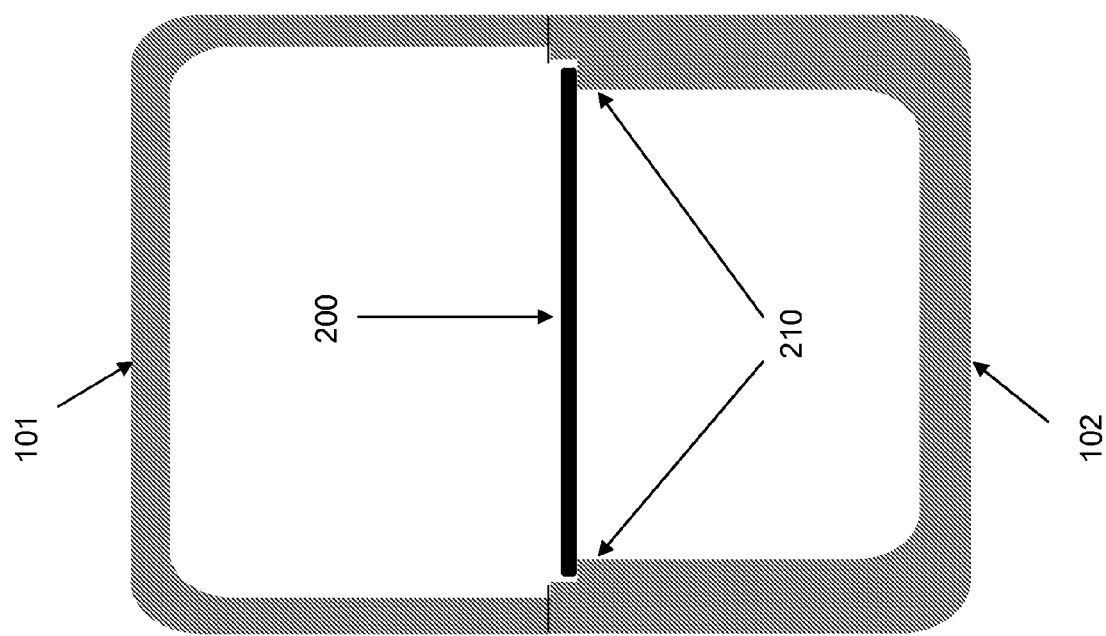

US 8,926,803 B2

POROUS SILICON ELECTRO-ETCHING SYSTEM AND METHOD

FIELD

The present disclosure relates to solar cells and methods of manufacture. More specifically, the present disclosure relates to a high volume porous silicon process.

DESCRIPTION OF THE RELATED ART

In the solar cell industry, known high-efficiency technologies usually use semiconductor-grade mono-crystalline silicon wafers, produced using extensive and costly process steps.

Presently, and into the foreseeable future, the use of costly high-quality bulk mono-crystalline-Silicon (c-Si) will be the cost barrier preventing all competing high-efficiency c-Si technologies from reaching the critical "grid-parity" cost threshold.

Existing technologies rely on a supply of semiconductor-grade substrates fabricated from expensive CZ or FZ mono-crystalline silicon ingots which are processed into substrates using a series of high-precision subtractive processes, such as ingot slicing, mechanical lapping, chemical etching and chemical-mechanical polishing.

The inherent cost of semiconductor-grade silicon substrates may prevent competing c-Si PV technologies from reaching grid-parity costs because of the high degree of silicon cost combined with the extensive substrate preparation steps.

SUMMARY

Therefore, it is an object of this disclosure to provide high productivity, low cost-of-ownership manufacturing equipment for the high-volume production of photovoltaic (PV) solar cell devices.

The PV solar cell architecture of the present disclosure may deliver best-of-class efficiency, over 20%, while consuming a small fraction, as little as 15%, of source silicon material, at a much lower cost than that used in the production of present high-efficiency cells.

It is a further object of this disclosure to reduce material processing steps and material cost compared to existing technologies by using gas-phase source silicon.

The present disclosure achieves high efficiency and low cost by using the disclosed process to grow the PV cell substrate from gas-phase source silicon into a substantially finished shape with close to 100% source-material utilization.

The presently disclosed substrate growth process allows the in-situ formation of three-dimensional structured substrates or two-dimensional substrates that may enhance efficiency through formation of highly effective light trapping PN junction structures.

The present disclosure teaches the fabrication of a sacrificial substrate base layer that is compatible with a gas-phase substrate growth process. Porous silicon is used as the sacrificial layer in the present disclosure.

Further, the present disclosure provides equipment to produce a sacrificial porous silicon PV cell-substrate base layer, which may assist in the fabrication of highly cost-effective and efficient mono-crystalline silicon PV solar cells.

The porous silicon process uses electrochemical etching of the bulk silicon surface to produce a controlled thickness of a highly porous silicon layer or a stack of multiple porous silicon layers referred to as the porous silicon layer system.

The porosity of the films may be controlled from 20% to 70% volumetric ratio of open porosity to silicon, and the thickness may be controlled from 0.2 μm to over 5 μm.

The electrochemical reaction is similar to processes most often referred to as "anodization" in the metal finishing industry. The basic reaction is shown in FIGS. 2 and 3.

The porous silicon layer system may provide two primary functions: 1) the porous silicon provides a sacrificial base on which the aforementioned gas-phase mono-crystalline silicon-cell substrate is grown, and 2) the porous silicon is removed after the growth of the mono-crystalline silicon-cell substrate, using a highly selective chemical etch process, a controlled mechanical process, or a combination of chemical and mechanical process, which results in the release of the cell substrate from the bulk-silicon wafer from which the porous silicon layer was originally formed.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the claims.

BRIEF DESCRIPTIONS OF THE DRAWINGS

The features, nature, and advantages of the disclosed subject matter may become more apparent from the detailed description set forth below when taken in conjunction with the drawings in which like reference numerals indicate like features and wherein.

Figure 4:
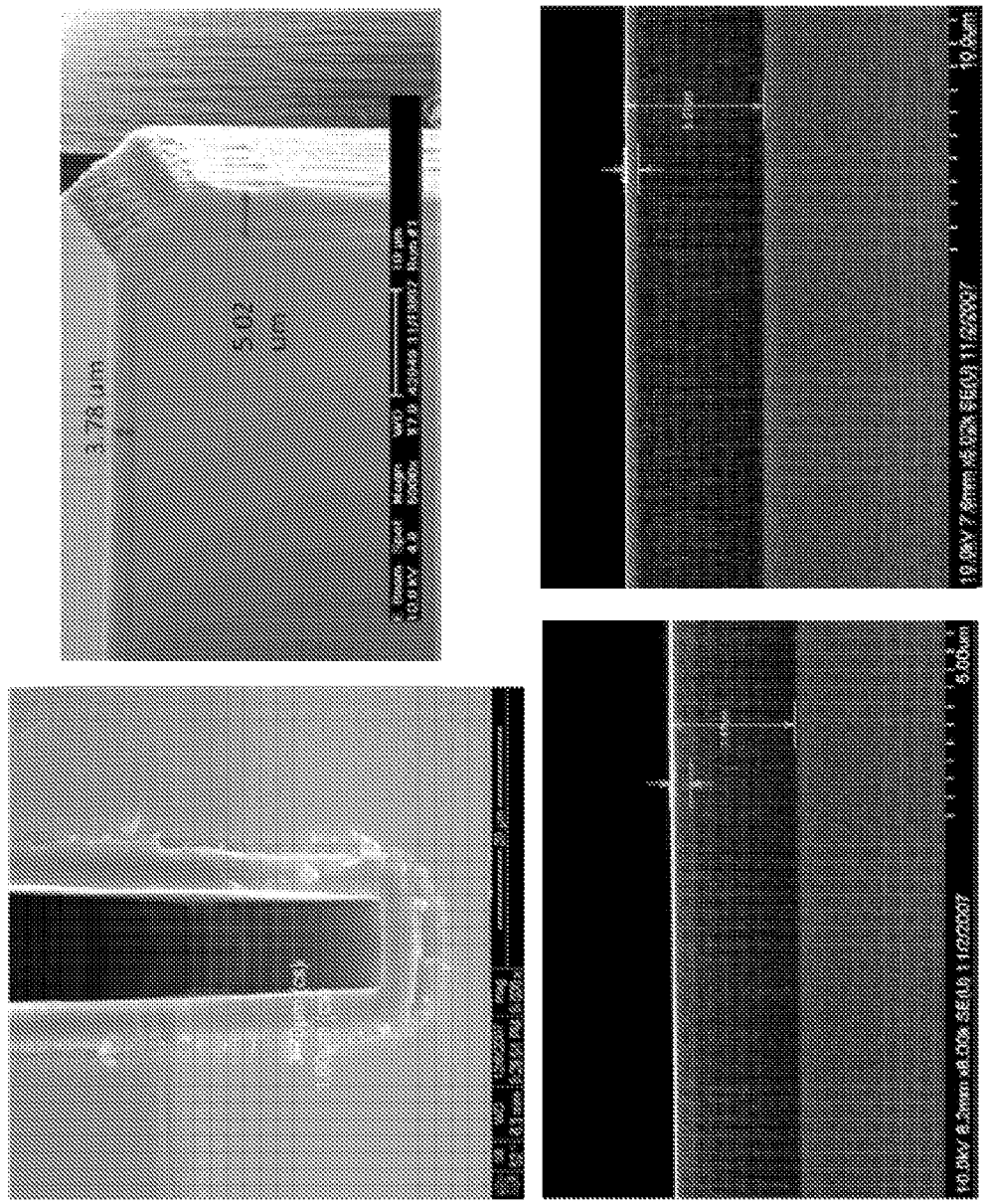
Figure 5:
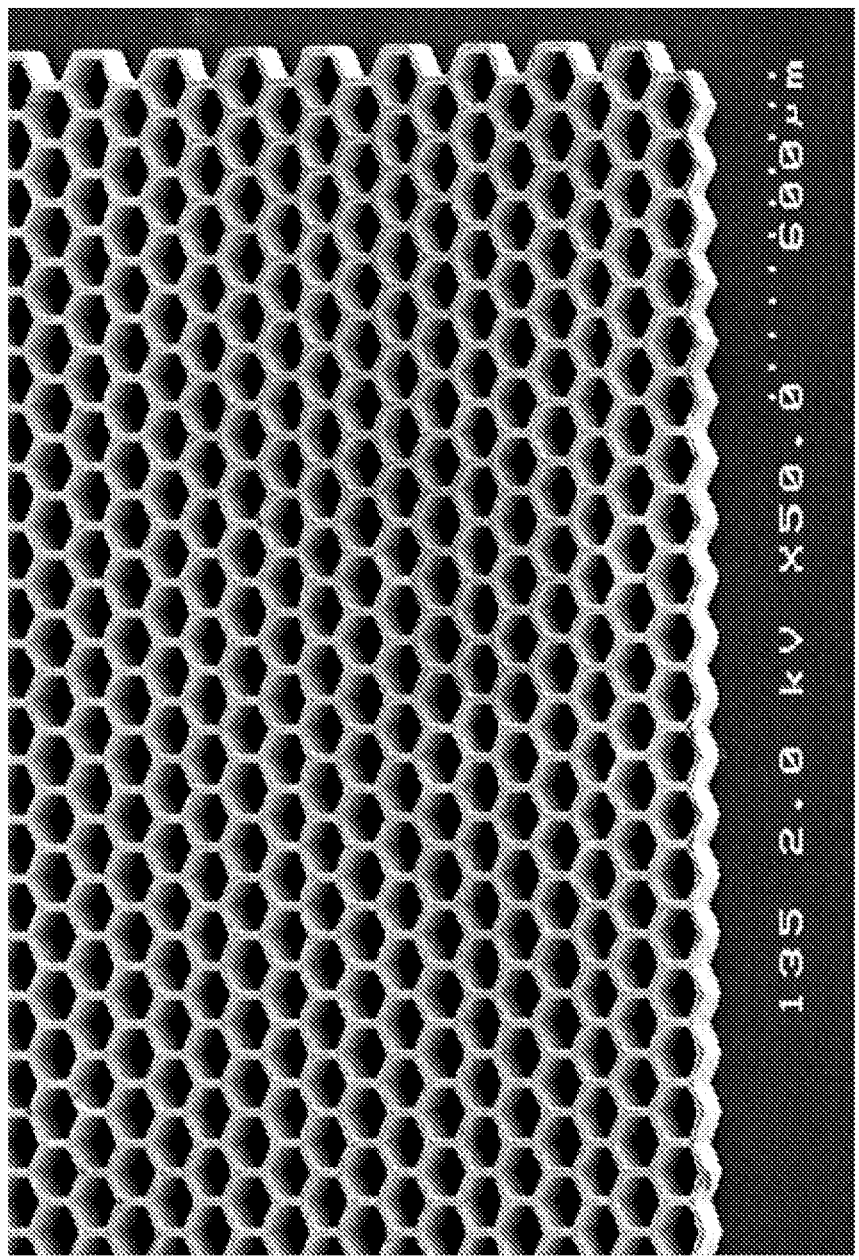
Figure 6:
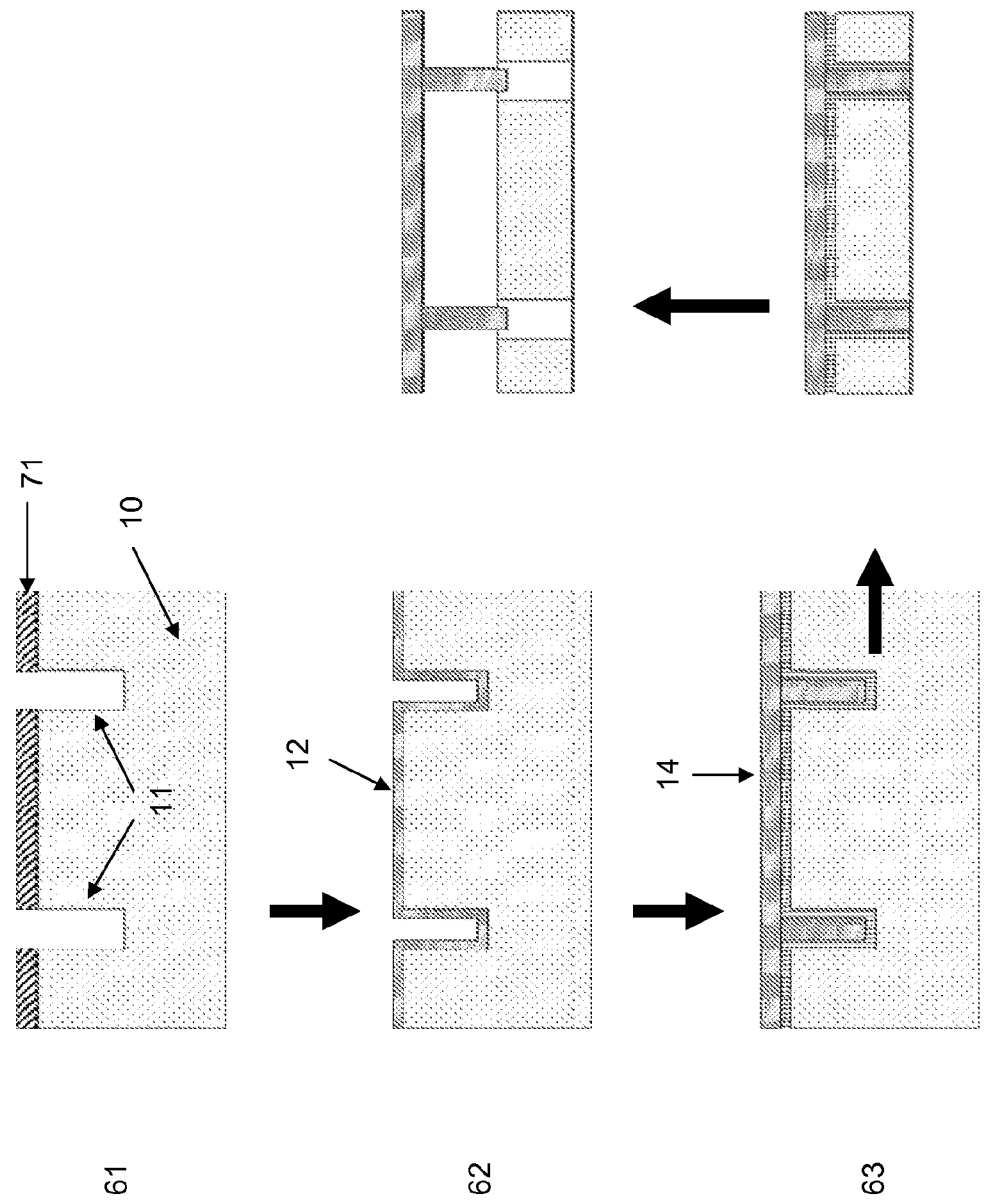
Figure 7:
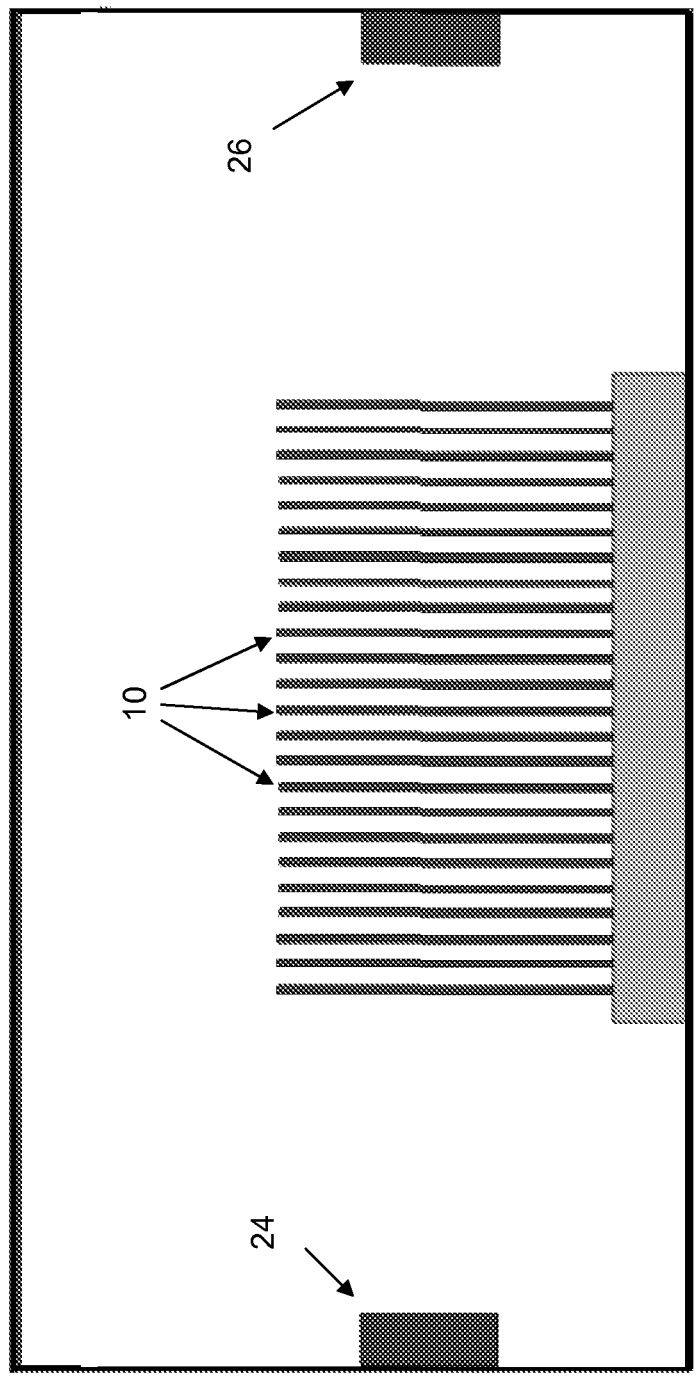
Figure 8:
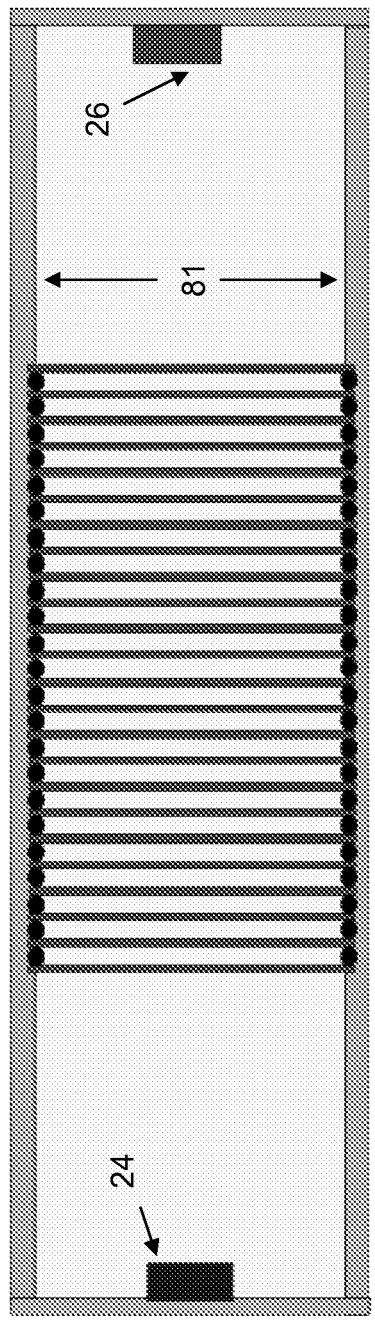
Figure 9:
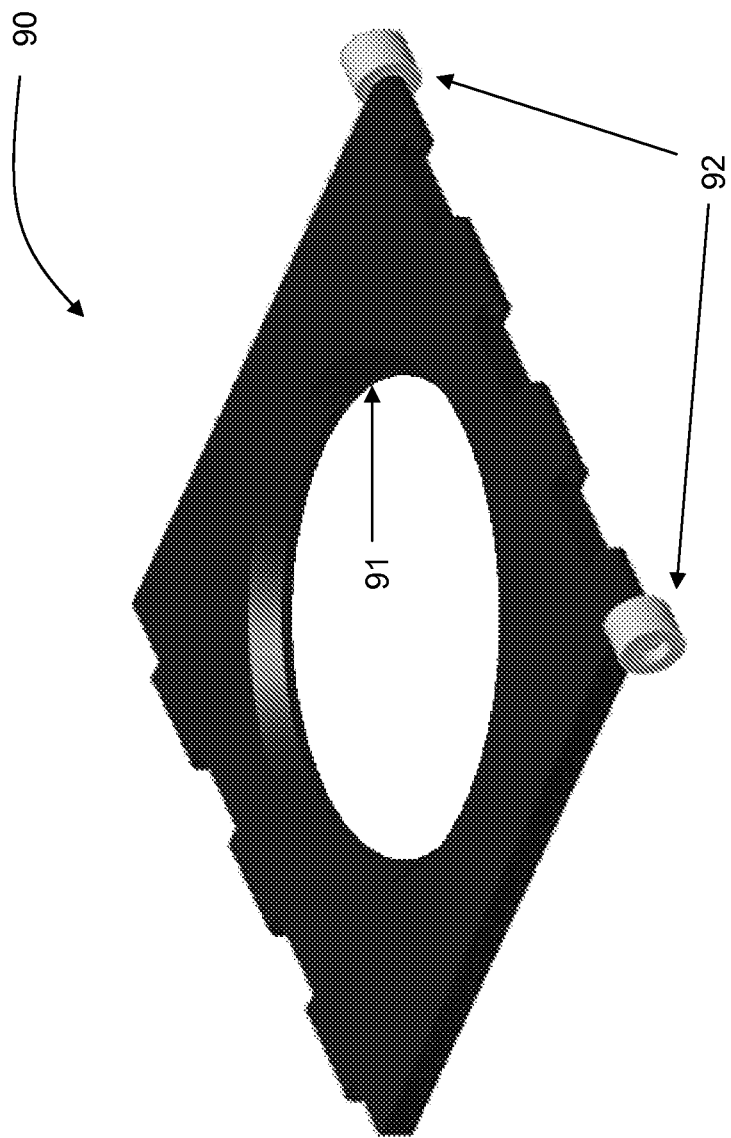
Figure 10:
Figure 12:
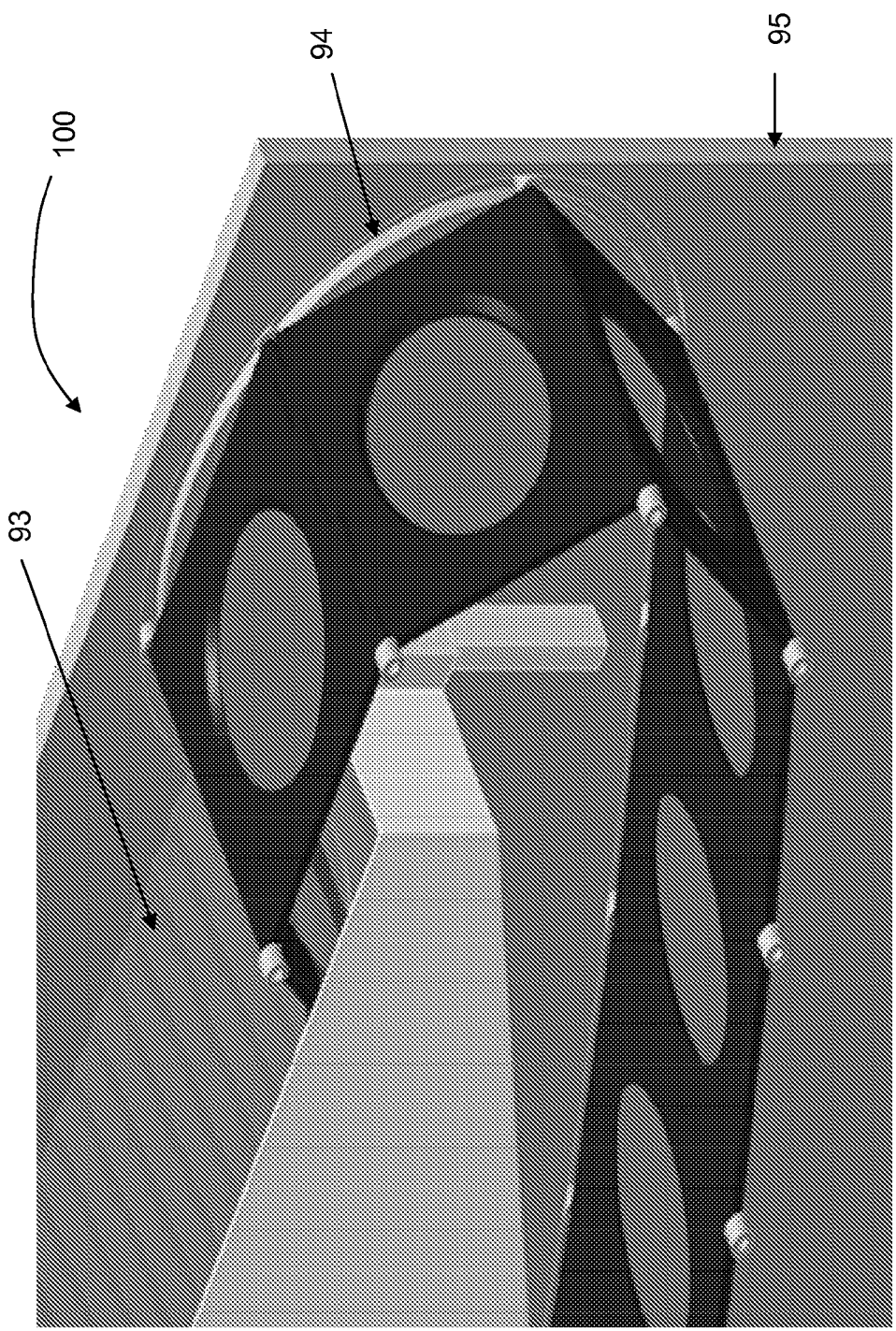
Figure 13:
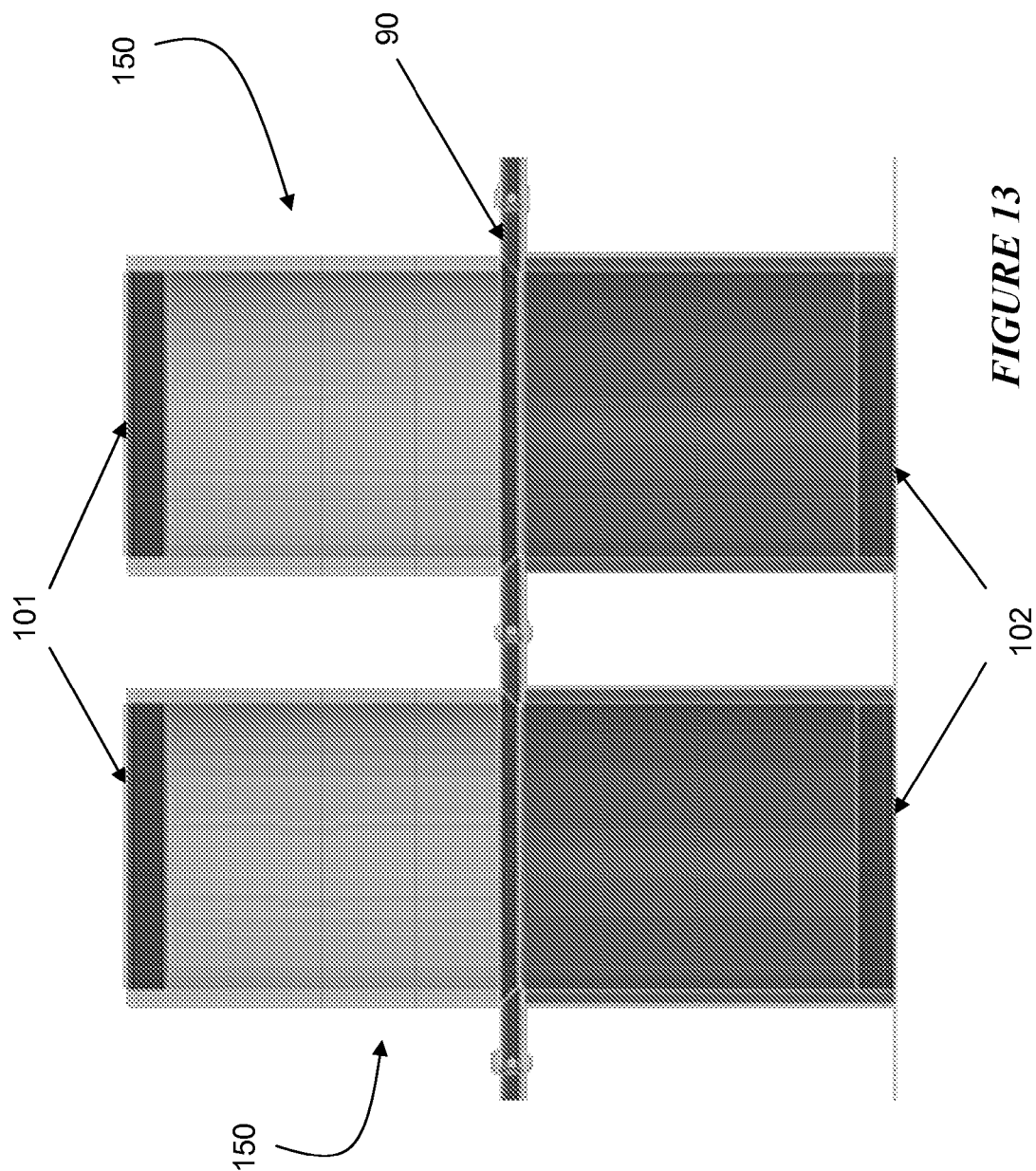
Figure 14:
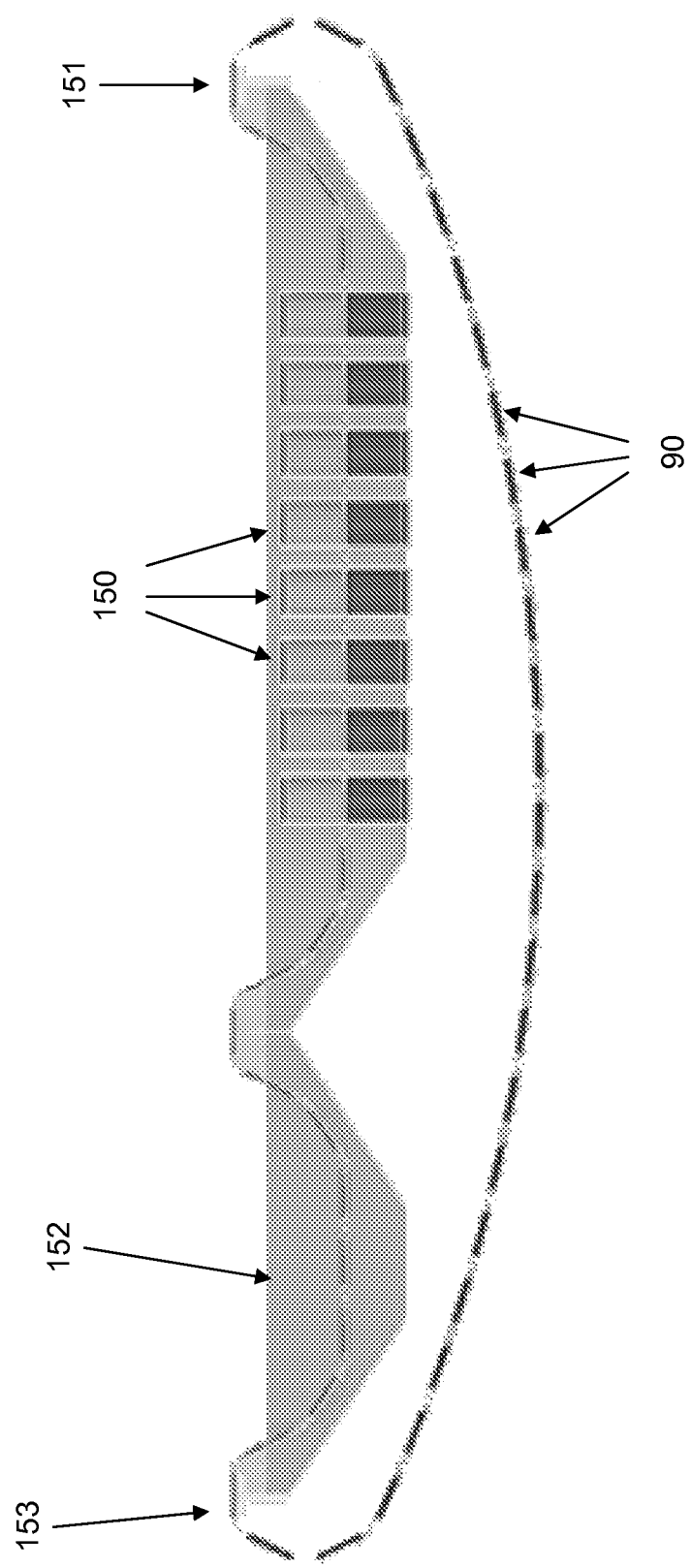
Figure 15:
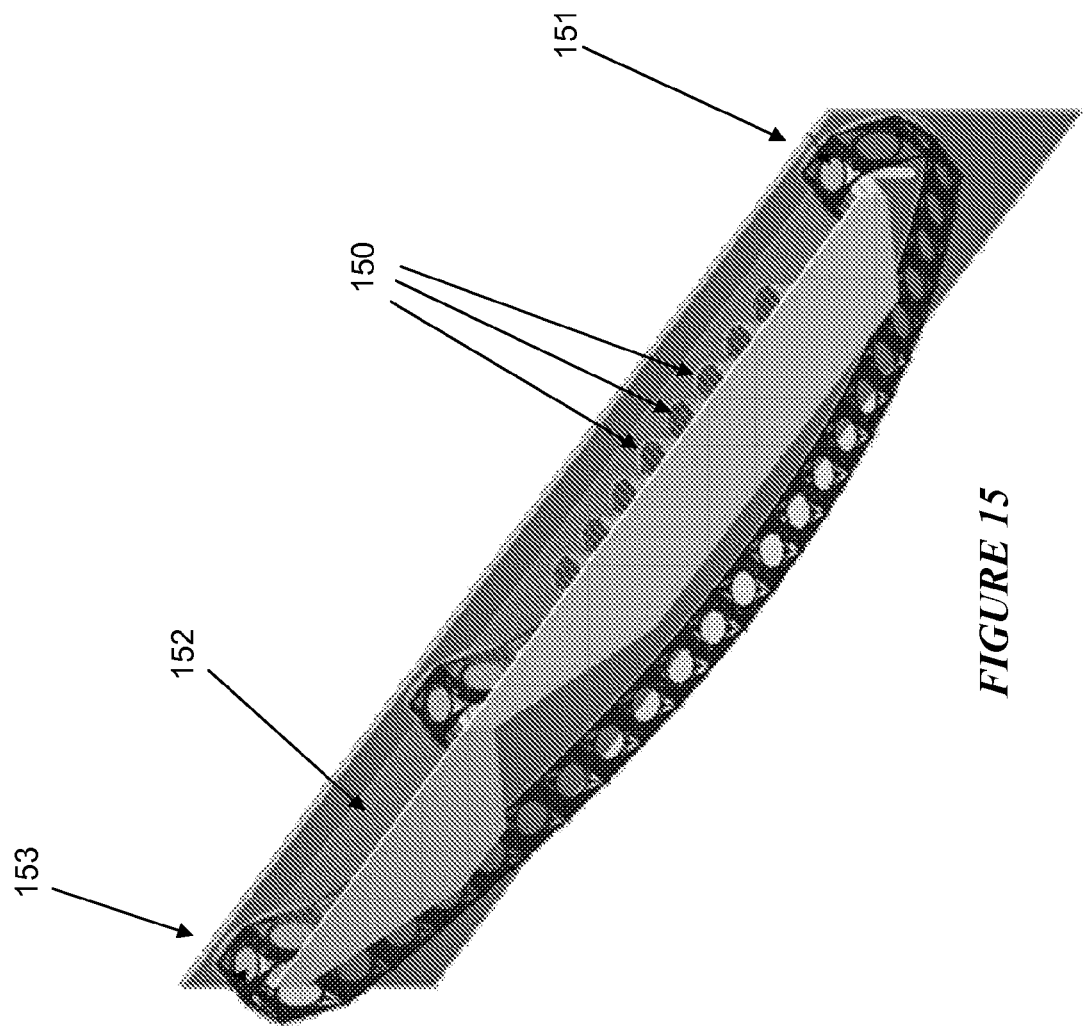

FIG. 4 provides photographs of a porous silicon layer or porous silicon layer system;

FIG. 5 provides a photograph of a 3-D substrate;

FIG. 6 provides an exemplary process for creating a 3-D thin film substrate;

FIG. 7 provides cross-sectional view of a stationary immersion tank embodiment;

FIG. 8 provides a top view of a stationary immersion tank embodiment;

FIG. 9 provides an isometric view of a wafer pallet;

FIG. 10 provides an isometric view of three wafer pallets;

FIGS. 11A and 11B provide top and cross-sectional views, respectively, of a palletized immersion tank;

FIG. 12 provides an isometric view of a palletized immersion tank;

FIG. 13 provides a cross-sectional view of two electrolytic chambers;

FIG. 14 provides a cross-sectional view of a palletized immersion tank demonstrating electrolytic chambers;

FIG. 15 provides an isometric view of a palletized immersion tank demonstrating electrolytic chambers; and FIG. 16 provides a cross-sectional view of an electrolytic cell and silicon wafer.

DETAILED DESCRIPTION

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

The present disclosure presents a PV cell substrate fabrication process flow using porous silicon as a sacrificial layer.

The system may produce porous silicon films with acceptable quality for supporting the manufacturing of PV cells. FIGS. 1-6 relate generally to production of PV cells.

Figure 1:
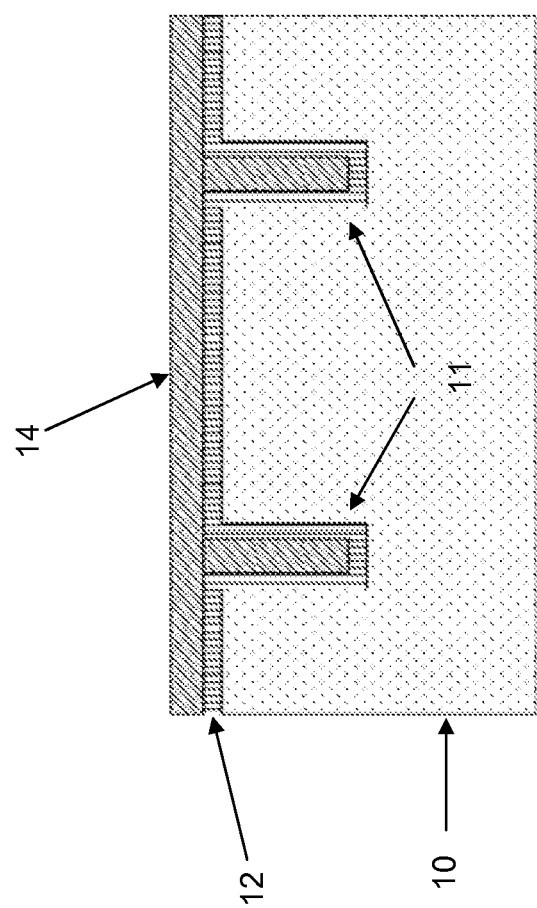
FIG. 1 shows a cross-sectional view of an embodiment of a basic template, porous silicon layer, and substrate configuration.

FIG. 1 shows a step in the process of creating a solar cell using the sacrificial porous silicon release layer of the present disclosure. Bulk p-type silicon wafer 10 has had trenches 11 patterned into it, for example by deep reactive-ion etching (DRIE) or by chemical etching. Then porous silicon layer 12 was created in accordance with the teachings of the present disclosure. Finally, solar cell substrate 14 was epitaxially deposited on top of layer 12 from gas-phase source silicon.

Figure 2:
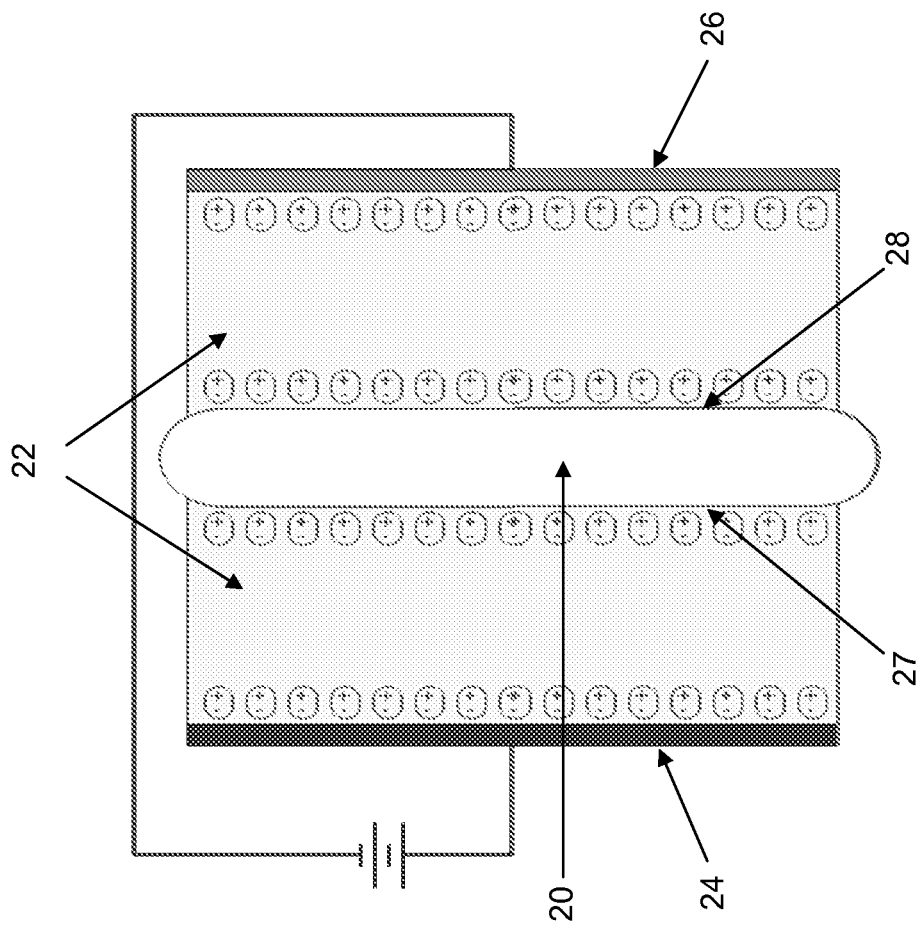
FIGS. 2 and 3 illustrate the anodization process.

FIG. 2 shows a schematic view of an electrochemical cell for producing a layer of porous silicon through anodization. Wafer 20 is placed in electrolyte bath 22, between anode 24 and cathode 26. In one embodiment, electrolyte bath 22 may be HF/IPA. A porous silicon film is created on wafer frontside 28 as current is passed through the system; no porous silicon is formed on wafer backside 27. As current runs through the system, hydrogen gas may be evolved at cathode 26 and wafer backside 27; oxygen gas may be evolved at anode 24 and wafer frontside 28.

Figure 3:
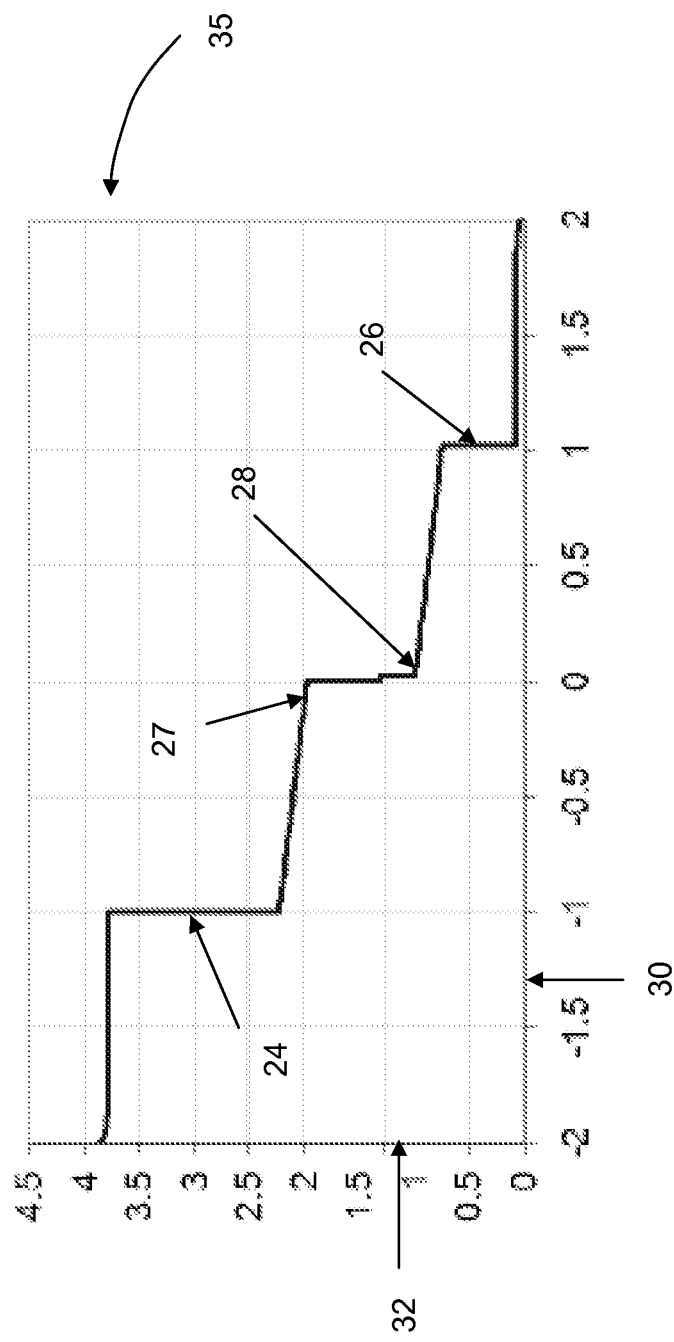

FIG. 3 shows a graph 35 of the voltage drop at different points in the electrochemical cell of FIG. 2. Horizontal axis 30 shows the axial position in inches. Wafer 20 is at the origin, 0 inches on horizontal axis 30. Vertical axis 32 shows the electrical potential in volts. Graph 35 shows that voltage drops exist at both electrodes, and at both surfaces of wafer 20.

FIG. 4 shows electron micrographs of porous silicon layers created in accordance with the present disclosure.

FIG. 5 shows a finished solar cell substrate created by using a porous silicon sacrificial layer in accordance with the present disclosure.

FIG. 6 illustrates a basic process flow for creating these cells. At step 61, bulk p-type wafer 10 has undergone frontside lithography and DRIE. The lithography has left layer 71 of resist, and the DRIE has created trenches 11.

At step 62, resist 71 has been stripped away from wafer 10, and wafer 10 has been cleaned. Then a sacrificial layer system 12 of porous silicon has been grown on the frontside of wafer 10.

At step 63, solar cell substrate 14 has been epitaxially deposited onto sacrificial layer system 12. At step 64, substrate 14 has been diced to the correct size (in one embodiment, five inches square), and its backside has been lapped (in one embodiment, to approximately 260 um).

At step 65, sacrificial layer system 12 has been selectively etched, releasing substrate 14 from wafer 10.

The present disclosure is focused on the characterization of films treated with varying levels of porosity and annealing conditions relative to etch rate and compatibility with several etch chemistries.

The present disclosure teaches a porous silicon process system used to develop a high quality porous silicon electro-etching process that can be scaled into high volume PV cell manufacturing and can deliver very high wafer throughputs, on the order of 1,500 to 2,000 substrates per hour.

To accomplish these wafer throughputs, the present disclosure teaches transitioning from the present single-wafer, cylindrical, sealed electrolytic "chamber" configuration to an open-cell, unconfined or suitably confined multi-wafer immersion configuration for the silicon electro-etching process. This transition may enable high-throughput, low cost-of-ownership in-line conveyor style wafer handling and transport.

Because the silicon wafer may have a higher resistance than the surrounding electrolyte, if a conduction path is available that does not pass through the wafer, current may flow through the electrolyte without affecting the wafer. It is thus an object of the present disclosure to eliminate such conduction paths that do not pass through the wafer. A wafer transport pallet that isolates electrochemical conduction paths other than through the silicon wafer may force the electrical field to pass only through the silicon wafer.

FIG. 7 shows a cross-sectional view of an embodiment of a stationary immersion tank (in which the wafers do not move through the tank) designed for anodizing several wafers at once. A plurality of wafers 10 are submerged in an electrolyte, and electrodes 24 and 26 cause electrical current to flow through them.

FIG. 8 shows a top view of a similar stationary immersion tank embodiment. As shown, the tank may be sized so that wafers 10 form a seal with its side walls 81 as well as the top and bottom (not shown). Such a design may reduce the conduction paths that do not pass through the wafers, forcing current to flow through the wafers. In the stationary immersion tank design shown in FIGS. 7 and 8, the electrode voltage may need to be drastically increased relative to the voltage needed to anodize a single wafer. Because the wafers are electrically connected in series, the electrode voltage may scale approximately linearly with the number of wafers in the tank.

Palletized wafer handling may allow a higher rate of wafer throughput than the stationary immersion tank methods of FIGS. 7 and 8 and other methods previously known in the art. The pallet of the present disclosure may be used both to transport the wafer through the immersion electro-etching process and also to provide electrochemical isolation between the positive and negative electrodes in the cell without the need to directly contact the frontside of the wafer being electro-etched.

An embodiment 90 of a pallet according to the present disclosure is shown in FIG. 9. Pallet 90 includes a beveled circular opening 91 sized to fit the wafer. It also may include wheels 92 that fit into tracks and are used to guide the pallet on its path through the apparatus of the present disclosure. Pallet 90 may be made of a non-conductive material such as high-density polyethylene (HDPE). A plurality of pallets may be linked together, as shown in FIG. 10, for transport through a palletized immersion tank.

FIGS. 11A and 11B show views of one embodiment of a palletized immersion tank. In this embodiment, cathode 26 and anode (not shown) are elongated or suitably positioned electrodes to provide a uniform electric field across the wafer, extending along a substantial part of the length of the immersion tank. This configuration allows wafers to be anodized essentially continuously as they pass through the tank on pallets 90.

FIG. 12 shows a palletized immersion tank apparatus 100 including a plurality of pallets linked together in a loop and moving through a palletized immersion tank. Wheels 92 fit into tracks 94 on side plate 95 and a corresponding side plate (not shown) on the other side of the tank. Wafers may be automatically loaded onto the pallets before the pallets enter electrolyte 93 and automatically unloaded after they have passed through it and have emerged on the other side of the tank. A palletized immersion tank as shown in FIG. 12 may allow silicon wafers to be treated serially as they pass through the electrolyte bath, thus enabling a high-throughput porous silicon system.

The present disclosure includes a pallet-based wafer transport system, where the electrolytic cell is oriented vertically, with the wafer frontside facing upward and the wafer backside facing downward. The wafer transport pallets may be connected in-line and oriented perpendicular to the vertical electrolytic cell orientation. This may enable simple in-line wafer transport through the immersion electro-etching process system, while providing a compact spacing of electro-etching cells and a non-confined chamber design.

The wafer transport pallet-based electrolytic cell design of the present disclosure may eliminate the reliance on circumferential seals applied directly to the front and back of a silicon wafer. The present disclosure relies on a circumferential seal to the silicon wafer backside combined with the pressure head of the electrolyte that is created by a column of electrolyte above the silicon wafer and pallet. Since the frontside seal is eliminated, electro-etching may span the entire front surface of the wafer, with no exclusion zones from the wafer center to around the wafer edge. Thus, this design may provide full wafer edge bevel wrap-around electro-etching due to the lack of a frontside wafer seal. This is an improvement over prior art electro-etching systems, which may have difficulty etching a wafer all the way to its edge.

FIG. 13 shows a cross-sectional view of two electrolytic cells 150 that may be placed inside an immersion tank apparatus such as apparatus 100. Cathodes 101 are shown at the top of the electrolytic cells, facing the frontside of wafers as wafers pass through the system. Anodes 102 are shown at the bottom of the electrolytic cells, facing the backside of the wafers. High velocity jets (not shown) or other optimized flow dynamics may be used to sweep away gas evolved at the cathodes and anodes during anodizing, to maintain a good electrical connection.

FIG. 14 shows a schematic cross-sectional view of a palletized immersion tank incorporating a plurality of electrolytic cells 150. A motor (not shown) conveys pallets 90 in a loop through the electrolyte and the plurality of cells 150. Wafers may be loaded onto pallets at point 151. From there, they pass through cells 150 in the process tank and are electro-etched. Electrolyte may be rinsed from the wafers in rinse tank 152, which in some embodiments may contain deionized water. Wafers may then be unloaded at point 153 and further processed. FIG. 15 shows an isometric view of the same embodiment.

FIG. 16 shows another embodiment of an electrolytic cell in accordance with the present disclosure. The embodiment shown in FIG. 16 does not necessarily rely on palletized wafer handling.

Wafer 200 may be inserted into the electrolytic chamber by any suitable mechanism known in the art. For example, a robotic arm could be used to place the wafer in the chamber.

Inside the chamber, the back side of wafer 200 may rest on a circumferential sealing mechanism. As shown in FIG. 16, one possible sealing mechanism is a lip of a diameter somewhat smaller than the diameter of wafer 200. Lip 210 may be part of the chamber wall itself, or it may be, e.g., a ring inserted into the chamber and attached to the interior wall.

As shown in FIG. 16, the present disclosure does not necessarily require palletized wafer handling to achieve its non-frontside-contact seal. A pressure differential between the electrolyte in the top of the chamber and the electrolyte in the bottom of the chamber may provide a seal between wafer 200 and lip 210 regardless of the presence or absence of a pallet.

A silicon wafer electro-etching cell in which the silicon wafer has a three dimensional surface topography that forms a cavity or trench pattern may be used in the formation of crystalline silicon PV solar cell substrates. The silicon PV substrate may be formed on a layer of porous silicon using gas-phase deposition of silicon and then released from the fragile structure provided by the porous silicon layer. The porous silicon layer produced by this system is used as a release layer for the gas-phase deposited silicon substrate. The 3D patterned silicon wafer processed through this system is referred to in the FIGURES as a template.

The silicon wafer template is the equivalent of a 3D reverse mold for the fabrication of 3D shaped silicon substrates. This pallet-based non-frontside-sealed electro-etching process cell design also has the advantage that frontside template topography does not interfere with the ability to produce a continuous, high-uniformity porous silicon layer, since there is no direct-contact frontside seal on the template wafer.

The present disclosure includes an open electrolytic cell that applies a differential pressure (top vs. bottom) on a silicon wafer by confining a tall column of electrolyte on the frontside of the wafer and providing an electrolytic contact on the backside of the silicon wafer that applies little or no upward force to the wafer. This ensures a differential pressure load on the wafer, which compresses the seal between the wafer backside and the pallet top-edge.

A non-confined silicon wafer electro-etching cell design may transport silicon wafers on pallets that are transported through a single or a series of electrolytic cells using a continuous conveyor system, or it may simply rely on a lip inside the electrolytic cells to support the wafer and ensure a uniform electric field across the entire wafer.

The present disclosure provides an electro-etching system which consists of conveyorized transport of wafer-holding pallets, in which the pallets form an integral and critical functional component of the electrolytic cell and a means of sealing a silicon wafer solely from the backside of the wafer. This sealing allows the prevention of shadowing, blocking, and exclusion zones on the wafer frontside. The pallets also provide transport from wafer loading to wafer un-loading through the electro-etching system. The pallets are a component of some embodiments of the present disclosure, but they are not a necessary component of all embodiments.

The transition from a single-wafer sealed cylindrical chamber in known systems to the newly presented in-line immersion configuration may result in a significant increase in the electrical field and an improved porous silicon distribution across the surface of the wafer in process.

The pallet and conveyor based in-line immersion porous silicon electro-etching process system embodiment of the present disclosure is designed with several key components and design considerations, which may be varied in order to change the characteristics of the resulting system. Some of these design considerations include the following: electrode shape, size and spacing; electrode segmentation (multi-staged electrodes); electrode material; electrode current density; AC, DC, or pulsed current supply; wafer-to-electrode spacing; wafer configuration (topography, via holes, wafer thickness, wafer doping conditions, and surface treatments); wafer orientation within the wafer processing zone; wafer processing zone shape and size; wafer transport speed through the processing zone; reactant-gas extraction from the wafer in process (avoidance of gas bubbles and the resulting blocked electro-etching); electrolyte concentrations, flow rates, and flow direction; and electrolyte stability.

The foregoing description of embodiments is provided to enable a person skilled in the art to make and use the disclosed subject matter. Various modifications to these embodiments will be readily apparent to those skilled in the art, and the generic principles defined herein may be applied to other embodiments without the use of the innovative faculty.

What is claimed is:

1. An apparatus for producing porous silicon on a front side of a silicon wafer comprising:
   a wafer handling pallet comprising:
      an opening for holding the peripheral edge of the silicon wafer;
      a wafer backside sealing mechanism comprising a seal contacting only the backside of the wafer;
   a housing comprising at least one vertically oriented non-confined electrolytic cell;
   said vertically oriented electrolytic cell comprising:
      an anode positioned at the bottom of said electrolytic cell;
      a cathode positioned at the top of said electrolytic cell; and
      an electrolyte; and
   the housing and the wafer handling pallet configured so that a column of said electrolyte above the silicon wafer is applying pressure to the front side of the silicon wafer greater than the pressure applied to the backside of the silicon wafer, the differential pressure sealing the backside surface of the silicon wafer to said sealing mechanism.

2. The apparatus of claim 1, further comprising a rinsing mechanism using a spray of deionized water.

3. The apparatus of claim 1 further comprising a rinsing mechanism using a tank of deionized water.

4. The apparatus of claim 1, further comprising a motor for moving said wafer handling pallet through said at least one electrolytic cell.

5. The apparatus of claim 1, wherein said sealing mechanism comprises a circumferential seal within said electrolytic cell.

6. The apparatus of claim 5, further comprising a mechanism capable of placing the silicon wafer inside said electrolytic cell and removing the silicon wafer from said electrolytic cell.

7. The apparatus of claim 1, wherein said at least one electrolytic cell comprises a plurality of electrolytic cells.

8. The apparatus of claim 1, wherein said electrolyte of said at least one electrolytic cell comprises HF/IPA.

9. The apparatus of claim 1, wherein said at least one electrolytic cell further comprises an electrolyte jet for removing a gas from said anode.

10. The apparatus of claim 1, wherein said at least one electrolytic cell further comprises an electrolyte jet for removing a gas from said cathode.

11. The apparatus of claim 1, wherein said silicon wafer is a p-type silicon wafer.

12. The apparatus of claim 1, wherein said wafer handling pallet is made of a non-conductive material.

13. The apparatus of claim 12, wherein said non-conductive material is high-density polyethylene.

14. The apparatus of claim 1, further comprising a plurality of wafer handling pallets.

15. The apparatus of claim 14, wherein said plurality of wafer handling pallets are connected in-line.

16. The apparatus of claim 14, further comprising a motor for moving said plurality of wafer handling pallets through said at least one electrolytic cell.

17. The apparatus of claim 7, further comprising a plurality of wafer handling pallets.

18. The apparatus of claim 17, wherein said plurality of wafer handling pallets are connected in-line.

19. The apparatus of claim 17, further comprising a motor for moving said plurality of wafer handling pallets through said plurality of electrolytic cells.

20. The apparatus of claim 7, wherein said electrolyte of said plurality of electrolytic cells comprises HF/IPA.

* * * * *